US011794586B2

(12) United States Patent
Lakhkar et al.

(10) Patent No.: US 11,794,586 B2
(45) Date of Patent: Oct. 24, 2023

(54) MAGNETIC HIGH VOLTAGE INTERLOCK LOOP (HVIL) FOR VARIABLE FREQUENCY DRIVES IN TRANSPORT APPLICATIONS

(71) Applicant: Emerson Climate Technologies, Inc., Sidney, OH (US)

(72) Inventors: Nikhil R. Lakhkar, Troy, OH (US); Kevin J. Gehret, Fort Loramie, OH (US); Donald Wayne Cox, Miamisburg, OH (US); Russ M. Beisner, Versailles, OH (US)

(73) Assignee: Copeland LP, Sidney, OH (US)

( * ) Notice: Subject to any disclaimer, the term of this patent is extended or adjusted under 35 U.S.C. 154(b) by 93 days.

(21) Appl. No.: 17/580,441

(22) Filed: Jan. 20, 2022

(65) Prior Publication Data

US 2022/0371445 A1    Nov. 24, 2022

Related U.S. Application Data

(60) Provisional application No. 63/191,169, filed on May 20, 2021.

(51) Int. Cl.
*B60L 3/04* (2006.01)
*B60L 3/00* (2019.01)
(Continued)

(52) U.S. Cl.
CPC ............... *B60L 3/04* (2013.01); *B60L 3/0069* (2013.01); *G01R 33/072* (2013.01); *H01H 31/04* (2013.01)

(58) Field of Classification Search
CPC ....... B60L 3/04; B60L 3/0069; G01R 33/072; H01H 31/04
(Continued)

(56) References Cited

U.S. PATENT DOCUMENTS 6,032,004 A    2/2000  Mirabella, Jr. et al.
7,235,901 B2 *  6/2007  Bares ........................ E02F 9/24
                                                  307/328
(Continued)

FOREIGN PATENT DOCUMENTS

WO    WO-2020193466 A1    10/2020

OTHER PUBLICATIONS

Chen, et al.; Electrified Automotive Powertrain Architecture Using Composite DC-DC Converts, printed Mar. 26, 2021, 19 pages.
(Continued)

*Primary Examiner* — Kevin J Comber
*Assistant Examiner* — Sreeya Sreevatsa
(74) *Attorney, Agent, or Firm* — Harness, Dickey & Pierce, P.L.C.; Anthony G. Fussner

(57) ABSTRACT

A magnetic HVIL system for a drive in a transport application includes a Hall effect sensor within at least one housing of the drive that includes terminals and a removable cover. The removable cover includes a magnet having a magnetic field that is detectable by the Hall effect sensor when the removable cover is installed on the housing. The magnetic field of the magnet is not detectable by the Hall effect sensor when the removable cover is removed from the housing. The magnet HVIL system is configured to be operable to enable active operation of the drive when the Hall effect sensor detects the magnetic field of the magnet and is in a closed circuit condition and disable operation of the drive when the Hall effect sensor does not detect the magnetic field of the magnet and is in an open circuit condition.

23 Claims, 12 Drawing Sheets

(51) Int. Cl.
*G01R 33/07* (2006.01)
*H01H 31/04* (2006.01)

(58) Field of Classification Search
USPC .......... 324/207.2; 361/88; 307/125, 9.1, 328
See application file for complete search history.

(56) References Cited

U.S. PATENT DOCUMENTS

| | | | |
|---|---|---|---|
| 7,586,722 | B2 | 9/2009 | Scholer et al. |
| 9,327,601 | B2 | 5/2016 | Demmerle et al. |
| 10,121,620 | B2 * | 11/2018 | Platzer ............... H01H 36/0046 |
| 11,052,782 | B1 * | 7/2021 | Lemberg .................. H02J 7/04 |
| 2011/0037317 | A1 * | 2/2011 | Kuschnarew ......... B60L 3/0061 |
| | | | 307/9.1 |

OTHER PUBLICATIONS

Chakraborty et al., DC-DC Converter Topologies for Electric Vehicles, Plug-in Hybrid Electric Vehicles and Fast Charging Stations: State of the Art and Future Trends, www.mdpi.com/journal/energies, 2019; 43 pages.
APS11700 and APS11760 Micropower Vertical and Planar Hall-Effect Switches, www.allegromicro.com; Apr. 27, 2020, 24 pages.
2013-2017 Toyota Prius C 1.8L OEM Hybrid Inverter Converter/ G9200-52010; Ebay; Copyright 1995-2021; 5 pages.

* cited by examiner

MAGNETIC HIGH VOLTAGE INTERLOCK LOOP (HVIL) FOR VARIABLE FREQUENCY DRIVES IN TRANSPORT APPLICATIONS

CROSS-REFERENCE TO RELATED APPLICATION

This application claims priority to and the benefit of U.S. Provisional Patent Application No. 63/191,169 filed May 20, 2021. The entire disclosure of this provisional patent application is incorporated herein by reference.

FIELD

The present disclosure relates to magnetic High Voltage Interlock loop (HVIL) for variable frequency drives in transport applications.

BACKGROUND

This section provides background information related to the present disclosure which is not necessarily prior art.

A variable frequency drive in an electric vehicle transport (EVT) application may be supplied with a high-voltage power supply. Conventionally, the user may be required to manually unplug a cable after removing a cover from an input or output terminal box to disable output terminals of the variable frequency drive. After the cover is removed, however, the high-voltage power supply will be accessible until the user disables the output terminals by manually unplugging the cable.

DRAWINGS

The drawings described herein are for illustrative purposes only of selected embodiments and not all possible implementations and are not intended to limit the scope of the present disclosure.

Figure 4:
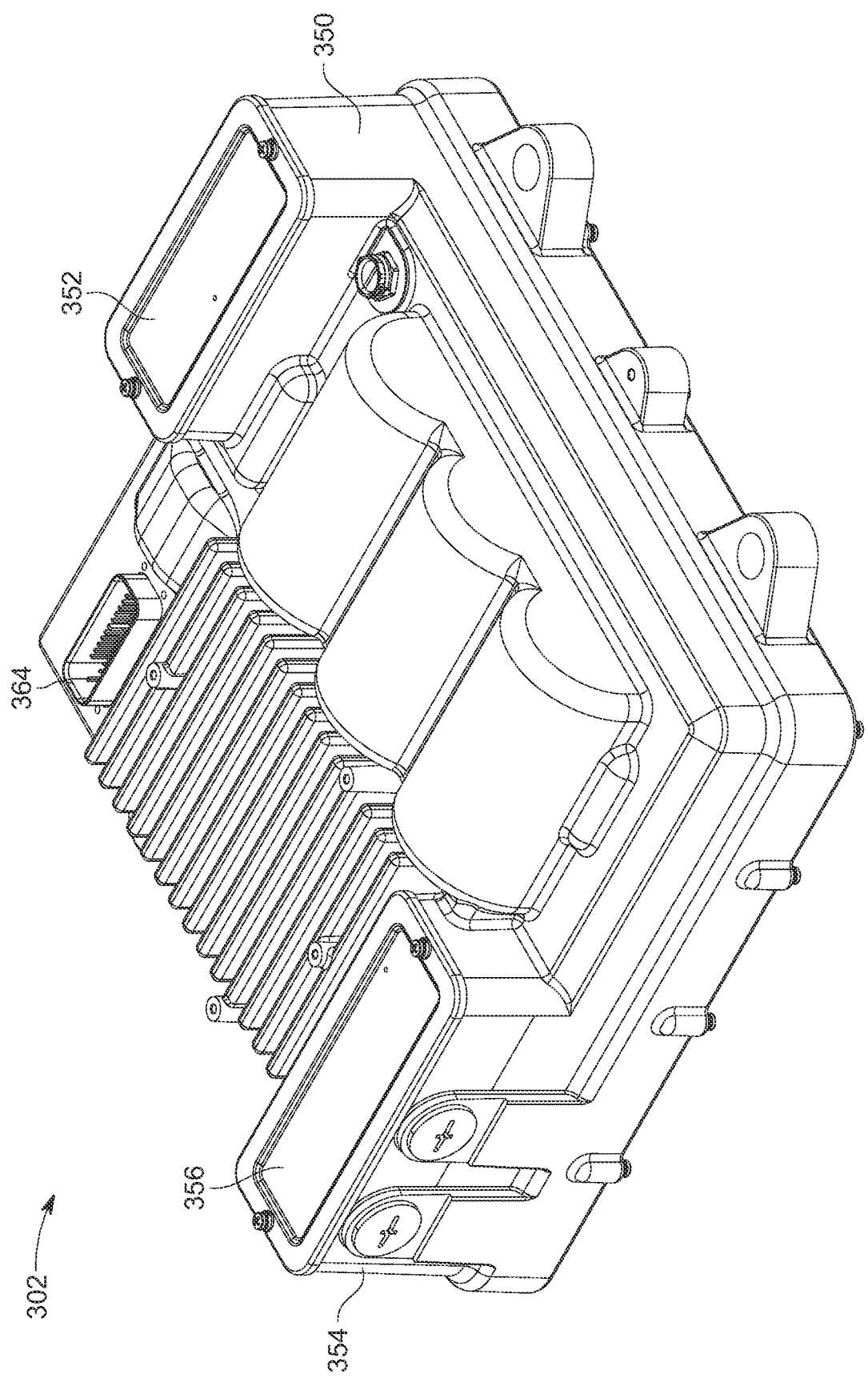
FIG. 4 is a perspective view of the variable frequency drive shown in FIG. 3 without the external fan.
Figure 5:
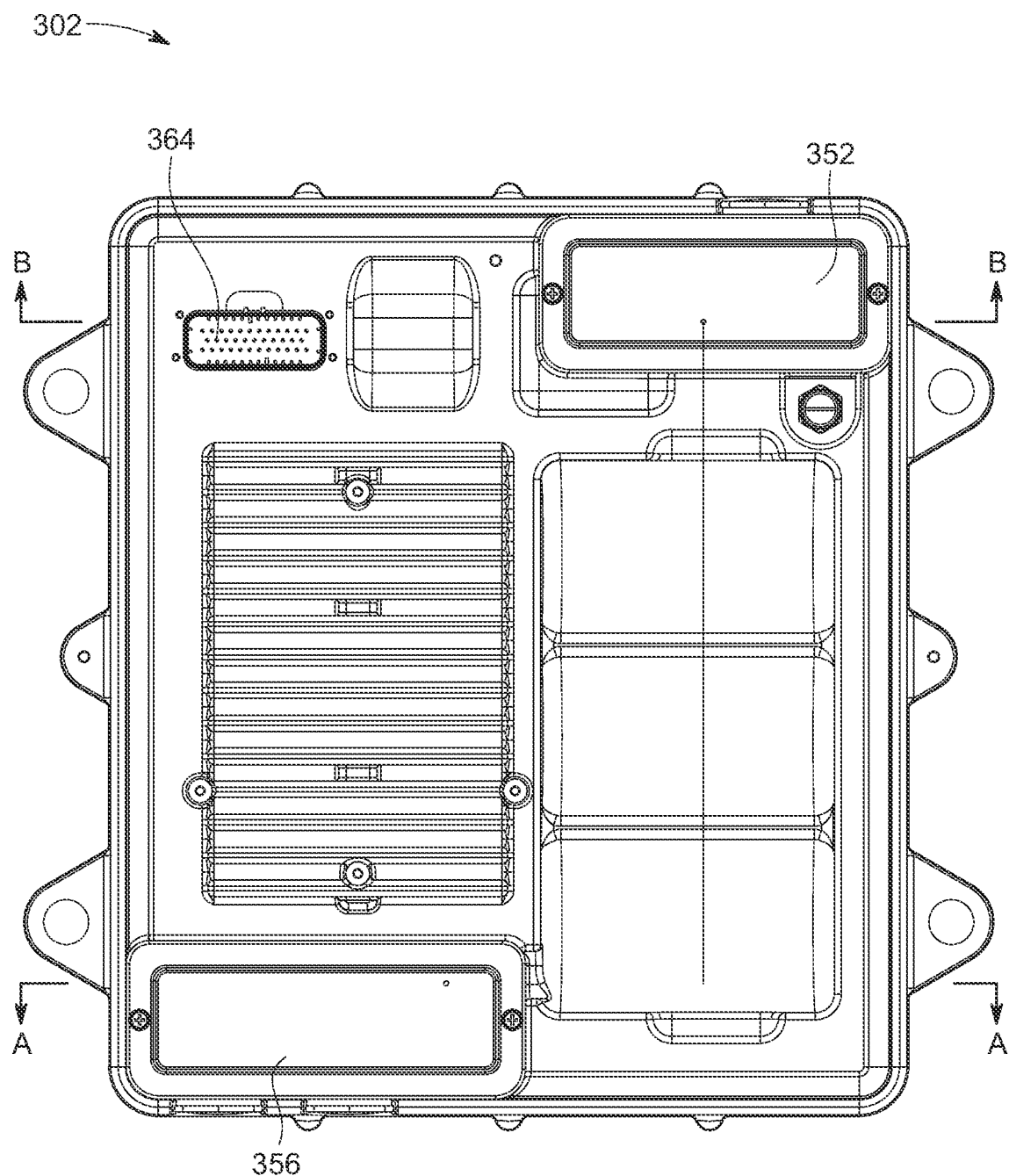
FIG. 5 is a top view of the variable frequency drive shown in FIG. 4.
Figure 6:
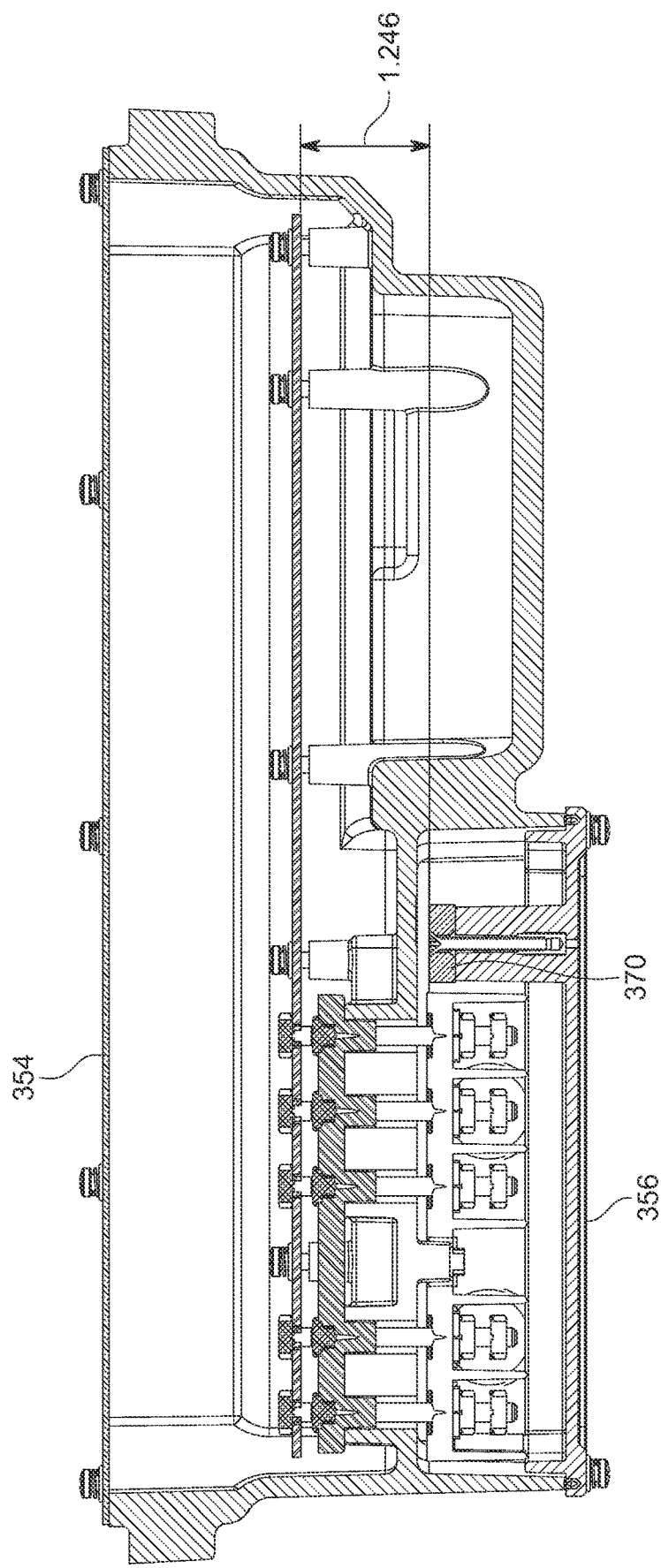
FIG. 6 is a cross-sectional view of the output terminal box of the variable frequency drive taken along a plane A-A in FIG. 5.
Figure 14:
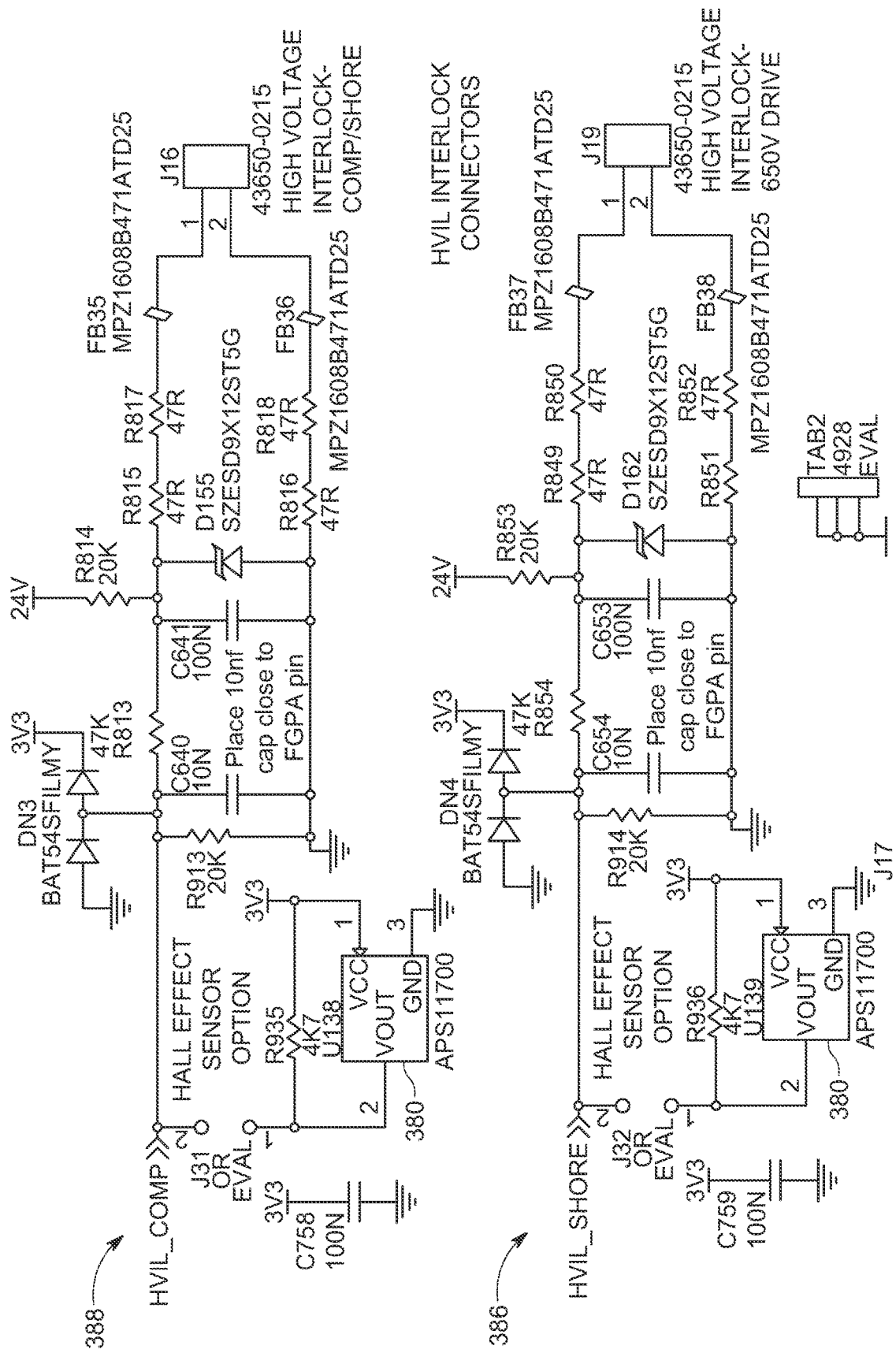

FIG. 14 includes circuit diagrams of exemplary HVIL interlock circuits for the output terminal box (HVIL_COMP) and the input terminal box (HVIL_SHORE) of the variable frequency drive shown in FIG. 4 according to an exemplary embodiment.

Corresponding reference numerals may indicate corresponding (though not necessarily identical) parts throughout the several views of the drawings.

DETAILED DESCRIPTION

Example embodiments will now be described more fully with reference to the accompanying drawings.

Disclosed herein are exemplary embodiments in which a magnetic High Voltage Interlock Loop (HVIL) is configured to be operable to enable or disable active operation of a variable frequency drive in a transport application, such as a transport application having an output voltage of at least 60 VDC (e.g., electric vehicles, hybrid vehicles, etc.) and/or an input voltage of at least 48 VDC (e.g., 48 VDC, 350 VDC, 650 VDC, etc.).

In exemplary embodiments, the variable frequency drive includes two terminal wiring housings, specifically, a first terminal wiring housing for input power and a second terminal wiring housing for output power. The first terminal wiring housing includes a first or input cover configured to cover the terminals within the first terminal wiring housing. The second terminal wiring housing includes a second or output cover configured to cover the terminals within the second terminal wiring housing. Features of the first and second terminal wiring housings and their first and second covers may be essentially identical or similar. For the sake of brevity, these identical or similar features shared by the first and second terminal wiring housings and the first and second covers will be described with reference to a terminal wiring housing and a cover and will not be individually repeated for each of the first and second terminal wiring housings and first and second covers.

The cover is securable to the housing with screws (broadly, mechanical fasteners) and sealed with a gasket (broadly, a seal). The cover includes a magnet that produces a magnetic field detectable by a Hall effect sensor (broadly, a magnetic proximity switch or sensor) within the housing. The Hall effect sensor may comprise a micropower hall-effect switch, integrated Hall-effect sensor integrated circuit (IC), etc.

The magnet and the Hall effect sensor are selectively located relative to each other such that the Hall effect sensor closes after detecting the magnetic field of the magnet when the cover is installed onto the housing. The installation of the cover onto the housing positions the magnet within the detection range of the Hall effect sensor such that the magnetic field of the magnet is detected by the Hall effect sensor.

A control is in communication with and monitors the status of the Hall effect sensor. The control is operable for enabling or disabling the power to the output terminals. When the magnetic field of the magnet is sensed by the Hall effect sensor, the Hall effect sensor is in a closed circuit condition, and the control enables voltage to the output terminals substantially instantaneously. Conversely, when the magnetic field of the magnet is not sensed by the Hall effect sensor during and/or after removal of the cover from the housing, the Hall effect sensor is in an open circuit condition, and the control disables voltage to the output terminals.

The magnet may be on a boss or inwardly protruding portion of the cover. The boss may be an integral portion (e.g., 3D printed portion, molded portion, etc.) of the cover that projects into the interior of the housing when the cover is secured to the housing so as to cover the terminals within the housing. The Hall effect sensor may be disposed along a bottom of the housing. In this example, the magnet may therefore be positioned closer to the Hall effect sensor as a result of the magnet being positioned along the boss of the cover that projects into the interior of the housing towards the bottom of the housing along with the PCB is disposed.

When the Hall effect sensor detects the magnetic field of the magnet on the input cover, the Hall effect sensor's resistance reduces and the current starts flowing thus completing the circuit and enabling the power supply to the variable frequency drive on the input side. The same circuit is on the output side as well. When Hall effect sensor detects the magnetic field of the magnet of the output cover, the Hall effect sensor's resistance reduces and the current starts flowing thus completing the circuit and enabling the power supply from the variable frequency drive on the output side, e.g., to a scroll compressor, etc.

The detection range in which the Hall effect sensor is able to detect the magnetic field of the magnet is preferably small, which will depend on the strength of the magnet, size of its magnetic field, and detection capability of the Hall effect sensor. Preferably, the magnet is a relatively weak magnet (e.g., a pull force of 21 or less pound force (lbf), 11 lbf, 13 lbf, 17 lbf, 21 lbf, etc.) that produces a weak magnetic field that is not detectable by the Hall effect sensor until the magnet is in relatively close proximity (e.g., about 1.25 inches or less, etc.) to the Hall effect sensor. In which case, the cover cannot be removed too far from the housing before the Hall effect sensor no longer detects the magnetic field of the magnet and the output power is disabled. This is an improvement over conventional systems that required the user to manually unplug a cable after removing the cover to disable the output terminals.

Figure 1:
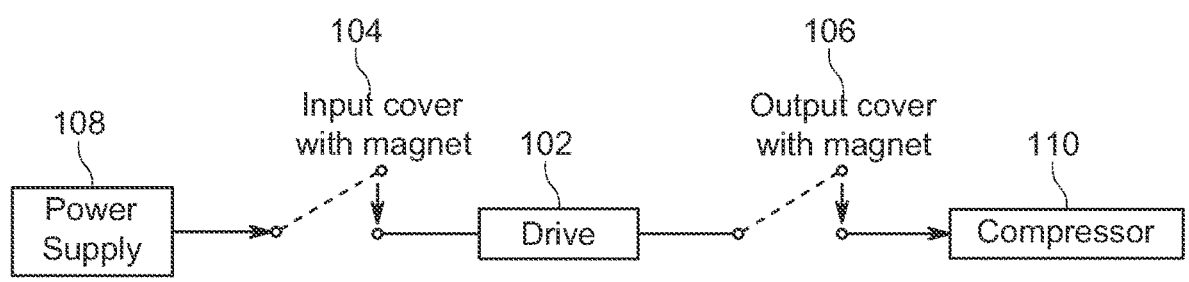
FIG. 1 is a block diagram illustrating a magnetic High Voltage Interlock Loop (HVIL) configured to enable or disable active operation of a drive according to an exemplary embodiment.

With reference now to the figures, FIG. 1 generally illustrates a magnetic High Voltage Interlock Loop (HVIL) configured to enable or disable active operation of a drive 102 (e.g., variable frequency drive, etc.) according to an exemplary embodiment. A first magnet is provided on an input cover 104 of a first terminal wiring housing for input power. A second magnet is also provided on an output cover 106 of a second terminal wiring housing for output power.

A first Hall effect sensor is positioned within the first terminal wiring housing for detecting the magnetic field of the first magnet of the input cover 104 when the input cover 104 is installed. When the first Hall effect sensor detects the magnetic field of the first magnet of the input cover 104, the first Hall effect sensor will complete or close the circuit and enable the power supply 108 (e.g., 48 VDC, 350 VDC, 650 VDC, etc.) to the drive 102 on the input side. Conversely, when the first magnet of the input cover 104 is not sensed by the first Hall effect sensor during and/or after removal of the input cover 104 from the first terminal wiring housing, the first Hall effect sensor is in an open circuit condition as shown in FIG. 1 that disables the power supply 108 to the drive 102.

A second Hall effect sensor is positioned within the second terminal wiring housing for detecting the magnetic field of the second magnet of the output cover 106 when the output cover 106 is installed. When the second Hall effect sensor detects the magnetic field of the second magnet of the output cover 106, the second Hall effect sensor will complete the circuit and enable the drive 102 to the compressor 110 (e.g., a scroll compressor, etc.) on the output side. Conversely, when the second magnet of the output cover 106 is not sensed by the second Hall effect sensor during and/or after removal of the output cover 106 from the second terminal wiring housing, the second Hall effect sensor is in an open circuit condition as shown in FIG. 1 that disables the drive 102 to the compressor 110.

The first and second Hall effect sensors may comprise micropower hall-effect switches, integrated Hall-effect sensor integrated circuits (ICs), etc. The first and second Hall effect sensors may be located (e.g., mounted, etc.) within the respective first and second terminal wiring housings along a side closest to the terminals. The first and second Hall effect sensors may be capable of sending the respective first and second magnets at a detection distance (e.g., about 1.25 inches or less, etc.) through air and the housing material (e.g., aluminum casting, etc.).

Figure 2:
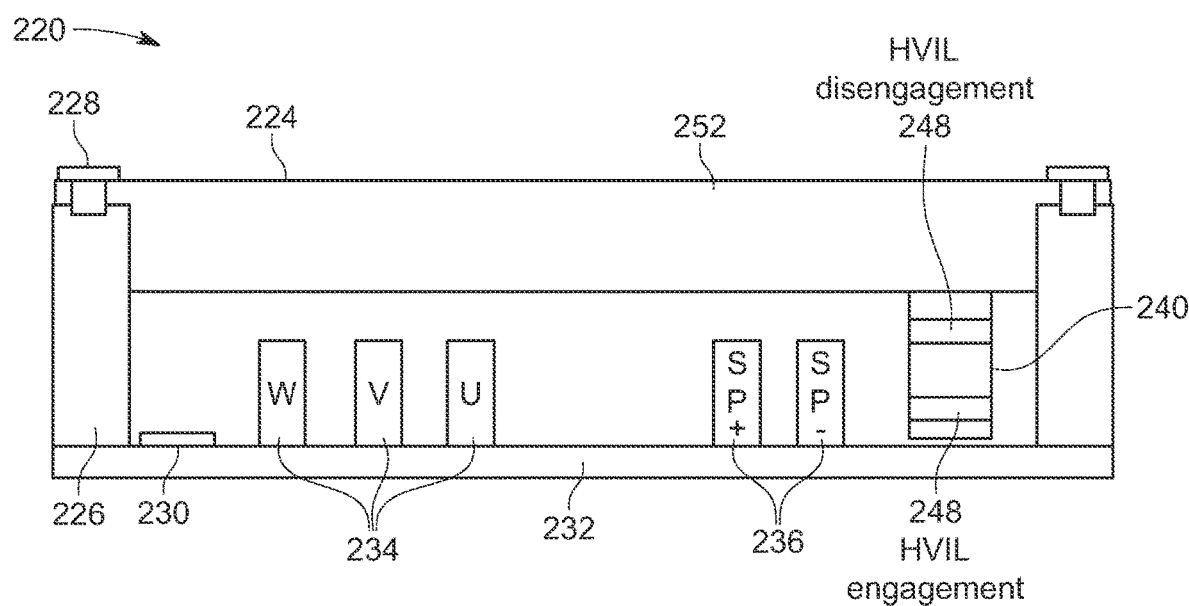
FIG. 2 illustrates a terminal wiring housing of a variable frequency drive that includes a magnetic High Voltage Interlock Loop (HVIL) according to an exemplary embodiment.

FIG. 2 illustrates a terminal wiring housing 220 of a variable frequency drive that includes a magnetic High Voltage Interlock Loop (HVIL) according to an exemplary embodiment. The variable frequency drive includes a first terminal wiring housing for input power that includes an input cover, and a second terminal wiring housing for output power that includes an output cover.

In this exemplary embodiment, the terminal wiring housing 220 shown in FIG. 2 is representative of the first terminal wiring housing for input power and the second terminal wiring housing for output power. Therefore, the first and second terminal wiring housings and their respective first and second covers may be essentially identical or similar. For the sake of brevity, the identical or similar features shared by the first and second terminal wiring housings and their respective first and second covers will be described with reference to the terminal wiring housing 220 and its cover 224 shown in FIG. 2.

The cover 224 is securable to the housing sidewalls 226 (e.g., aluminum casting, etc.) with screws 228 (broadly, mechanical fasteners) and sealed with a gasket (broadly, a seal). The cover 224 includes a magnet that produces a magnetic field detectable by a Hall effect sensor (broadly, a magnetic proximity switch or sensor) within the housing 220. The Hall effect sensor may comprise a micropower hall-effect switch, integrated Hall-effect sensor integrated circuit (IC), etc.

A circuit board is along a bottom wall 232 (e.g., aluminum casting, etc.) of the housing 220. The circuit board includes terminals (W, V, U) 234 and shore power positive and negative (SP+ and SP−) terminals 236. The shore power positive and negative terminals 236 may be configured as an output end of the drive that enables the drive to charge input batteries whenever the vehicle is not running and is externally being charged from an external power source. Also shown in FIG. 2 is a ground terminal 230 for the unit.

In this exemplary embodiment, the magnet is located along a boss or inwardly protruding portion 240 of the cover 224. The boss 240 may be an integral portion (e.g., 3D printed portion, molded portion, etc.) of the cover 224 that projects into the interior of the housing 220 when the cover 224 is secured to the housing 220 so as to cover the terminals 234, 236 within the housing.

The drive may include a 2-sided panel, and the Hall effect sensor may be mounted on a side closest to the terminals 234. The Hall effect sensor may be disposed along or adjacent a bottom wall 232 (e.g., aluminum casting, etc.) of the housing 220. In this example, the magnet may therefore be positioned closer to the Hall effect sensor as a result of the magnet being positioned along the boss 240 of the cover 224 that projects into the interior of the housing 220 towards the bottom 232 of the housing 220.

The magnet and the Hall effect sensor are selectively located relative to each other such that the Hall effect sensor closes after detecting the magnetic field of the magnet when the cover 224 is installed onto the housing 220. The installation of the cover 224 onto the housing 220 positions the magnet within the detection range (e.g., about 1.25 inches or less, etc.) of the Hall effect sensor such that the magnetic field of the magnet is detected by the Hall effect sensor.

In FIG. 2, the position 244 represents where the HVIL is engaged and loop is closed. The position 248 represents the disengaged position where loop is broken, and the drive is disconnected after the cover 224 has been lifted enough such that the magnet is out of the proximity of the Hall effect sensor to disengage drive instantly. The cover 224 may include a lip or sufficiently thick lower portion 252 such that the terminals remain covered by the cover's lip 252 and are inaccessible at least until the magnet is moved far enough away from the Hall effect sensor for HVIL disengagement. Accordingly, this exemplary embodiment provides safety by preventing a user from accessing high voltage. When the cover 224 is installed, the user is unable to access the terminals.

Figure 3:
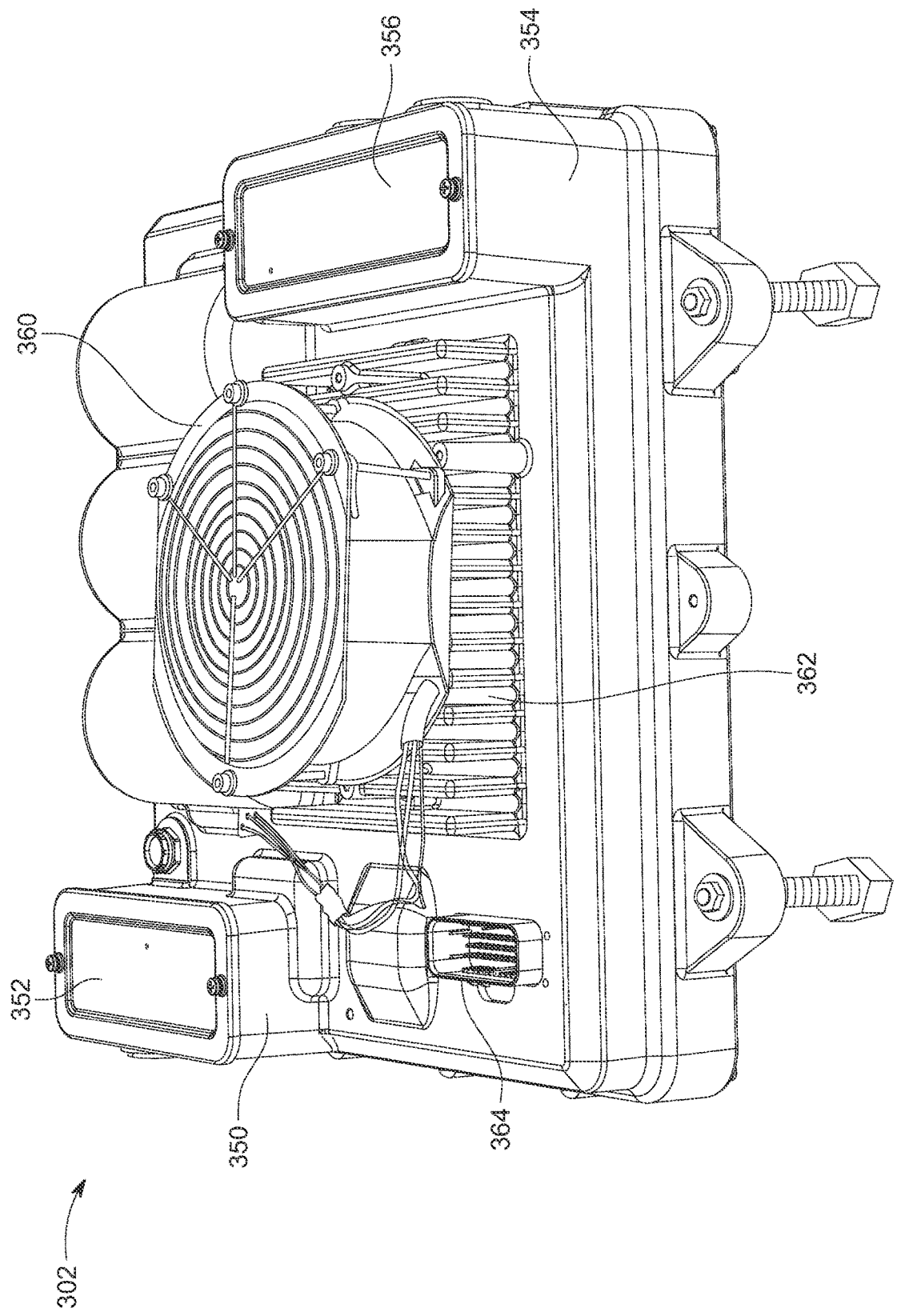
FIG. 3 illustrates a variable frequency drive including a magnetic High Voltage Interlock Loop (HVIL) configured to enable or disable active operation of the variable frequency drive according to an exemplary embodiment.

FIG. 3 illustrates a variable frequency drive 302 including a magnetic High Voltage Interlock Loop (HVIL) configured to enable or disable active operation of the variable frequency drive 302 according to an exemplary embodiment. The variable frequency drive 302 includes a first terminal wiring housing 350 for input power that includes a first or input cover 352, and a second terminal wiring housing 354 for output power that includes a second or output cover 356. The first and second terminal wiring housings 350, 354 are also referred to herein as input and out terminal boxes, respectively.

The variable frequency drive 302 includes an external cooling fan 360. The fan 360 is fastened (e.g., bolted, etc.) to the variable frequency drive 302 such that the fan 360 is disposed above fins 362 of the variable frequency drive 302. The variable frequency drive 302 further includes a communications port or connector 364. The connector 364 is operable as a digital input/output for extracting parameters from the drive 302 and providing input to fan 360, etc.

Figure 9:
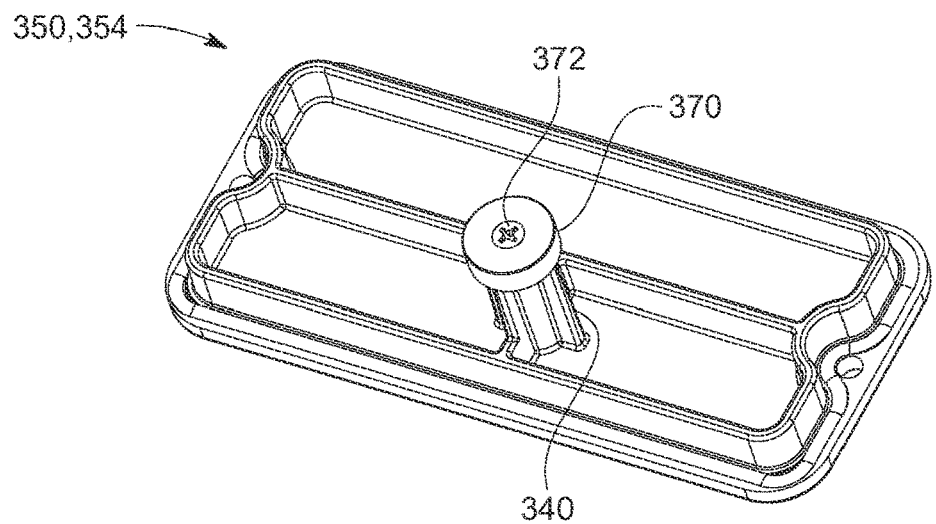
FIG. 9 is an inner perspective view of a cover after being removed from an input or output terminal box of the variable frequency drive shown in FIG. 4.
Figure 10:
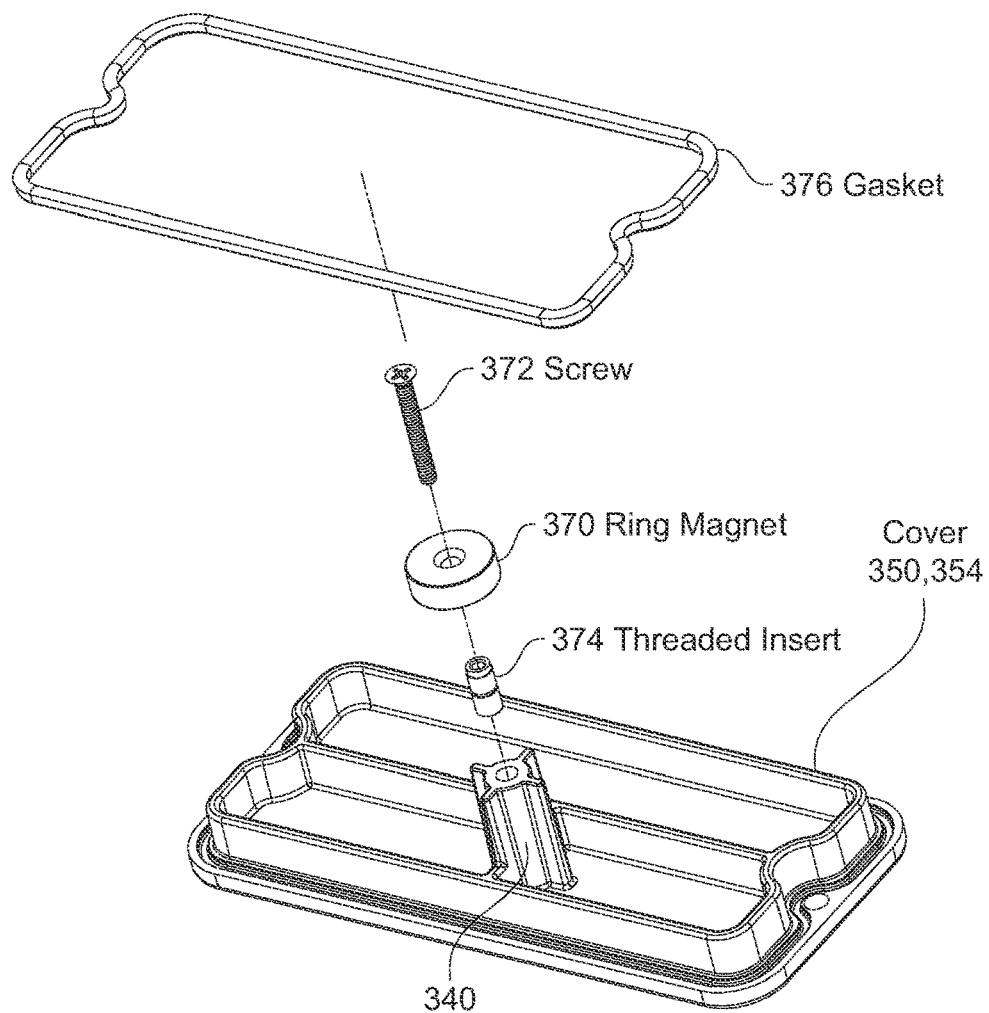
FIG. 10 is an exploded perspective view of the cover shown in FIG. 9 and illustrating the exemplary attachment of the magnet to the boss of the cover via a screw and a threaded insert according to an exemplary embodiment.

As shown in FIGS. 9 and 10, the first and second covers 352, 356 of the respective first and second terminal wiring housings 350, 354 may be essentially identical or similar. Each cover 352, 356 may include a magnet 370 disposed on or coupled to a boss or inwardly protruding portion 340 of the cover 352, 356. The boss 340 is an integral portion (e.g., 3D printed portion, molded portion, etc.) of the cover 352, 356 that projects into the interior of the corresponding first and second terminal wiring housings 350, 354 when the cover 352, 356 is installed.

The magnet 370 includes an opening for receiving a mechanical fastener therethrough. In this exemplary embodiment, the magnet 370 is a circular ring magnet having a circular thru-hole. The magnet 370 is mechanically fastened to the boss 340 via a screw 372 (broadly, mechanical fastener) and threaded insert 374. The threaded insert 374 is friction fit within an opening in the boss 340. The screw 372 is inserted through the circular thru-hole of the magnet 370 and threadedly engaged within the threaded insert 374.

Alternatively, other means for coupling the magnet 370 to the boss 340 may be used in other embodiments. For example, the magnet 370 may be adhesively attached to the boss 340 in another exemplary embodiment. Or, for example, the magnet 370 may be embedded or insert molded within boss 340 in a further exemplary embodiment.

A gasket 376 (broadly, a seal) may be used to seal the interface between the cover 352, 356 and the corresponding first and second terminal wiring housings 350, 354 when the cover 352, 356 is installed.

Figure 7:
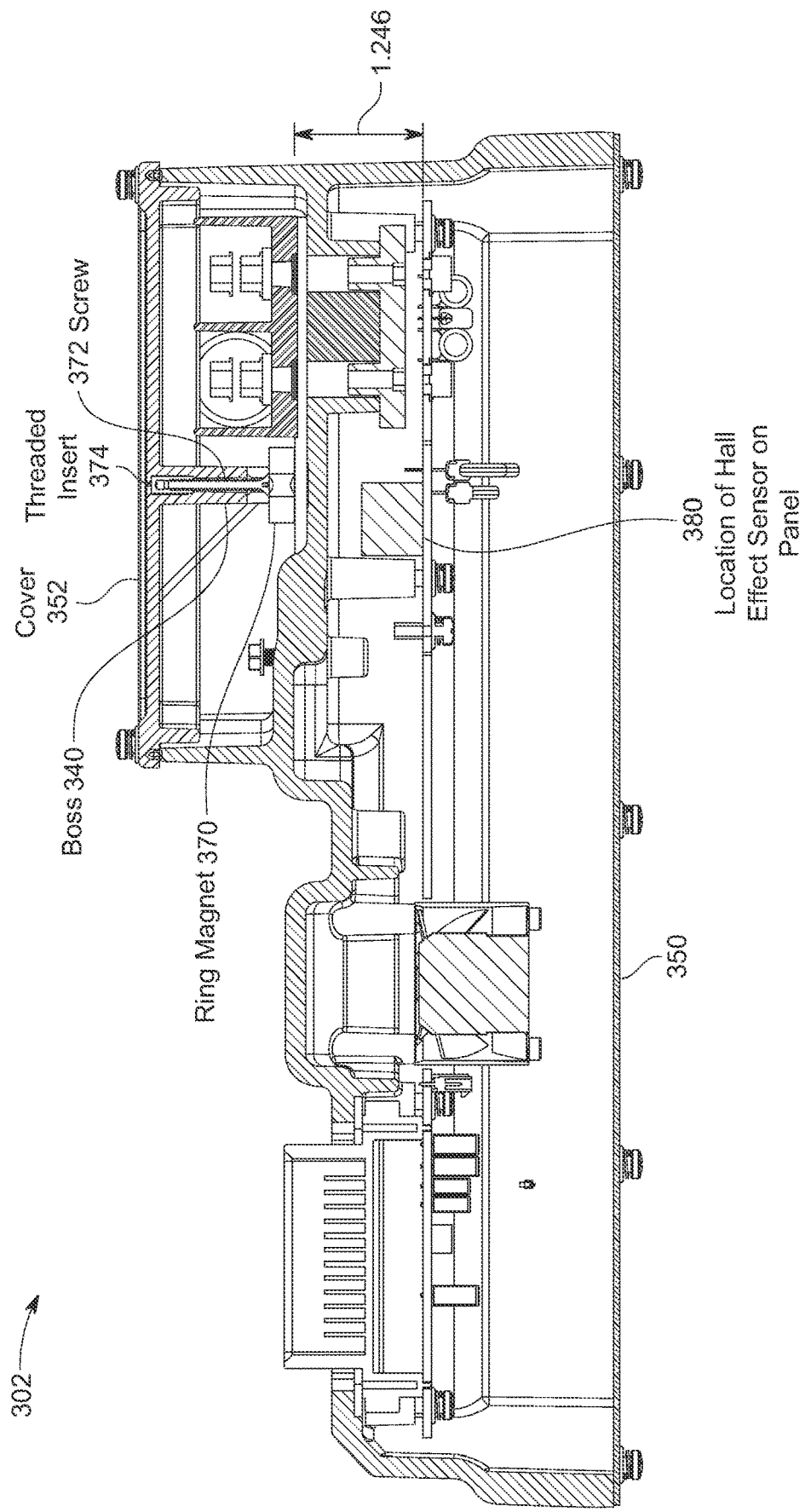
FIG. 7 is a cross-sectional view of the input terminal box of the variable frequency drive taken along a plane B-B in FIG. 5.
Figure 13:
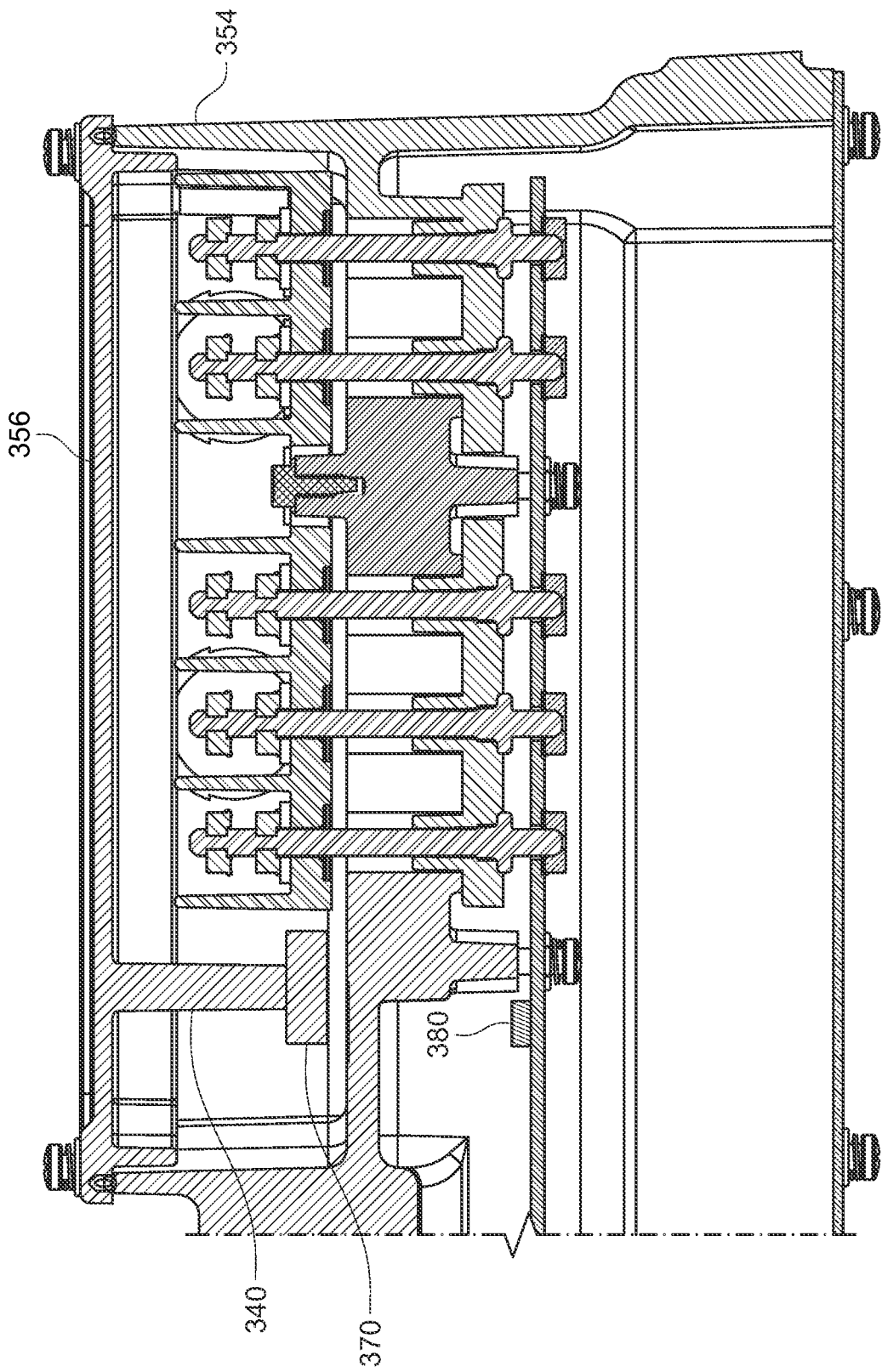
FIG. 13 is a partial cross-sectional view of the output terminal box of the variable frequency drive shown in FIG. 5 and illustrating the Hall effect sensor.

As shown in FIGS. 7 and 13, a Hall effect sensor 380 (broadly, a magnetic proximity switch or sensor) is positioned relative to the magnet 370 such that the Hall effect sensor 380 closes after detecting the magnetic field of the magnet 370 when the cover 352, 356 is installed onto the corresponding housing 350, 354. The installation of the cover onto the housing positions the magnet 370 within the detection range (e.g., about 1.25 inches or less (FIG. 7), etc.) of the Hall effect sensor 380 such that the magnetic field of the magnet 370 is detected by the Hall effect sensor 380. When the magnet 370 is not sensed by the Hall effect sensor 380 during and/or after removal of the cover from the housing, the Hall effect sensor 380 is in an open circuit condition.

Figure 8:
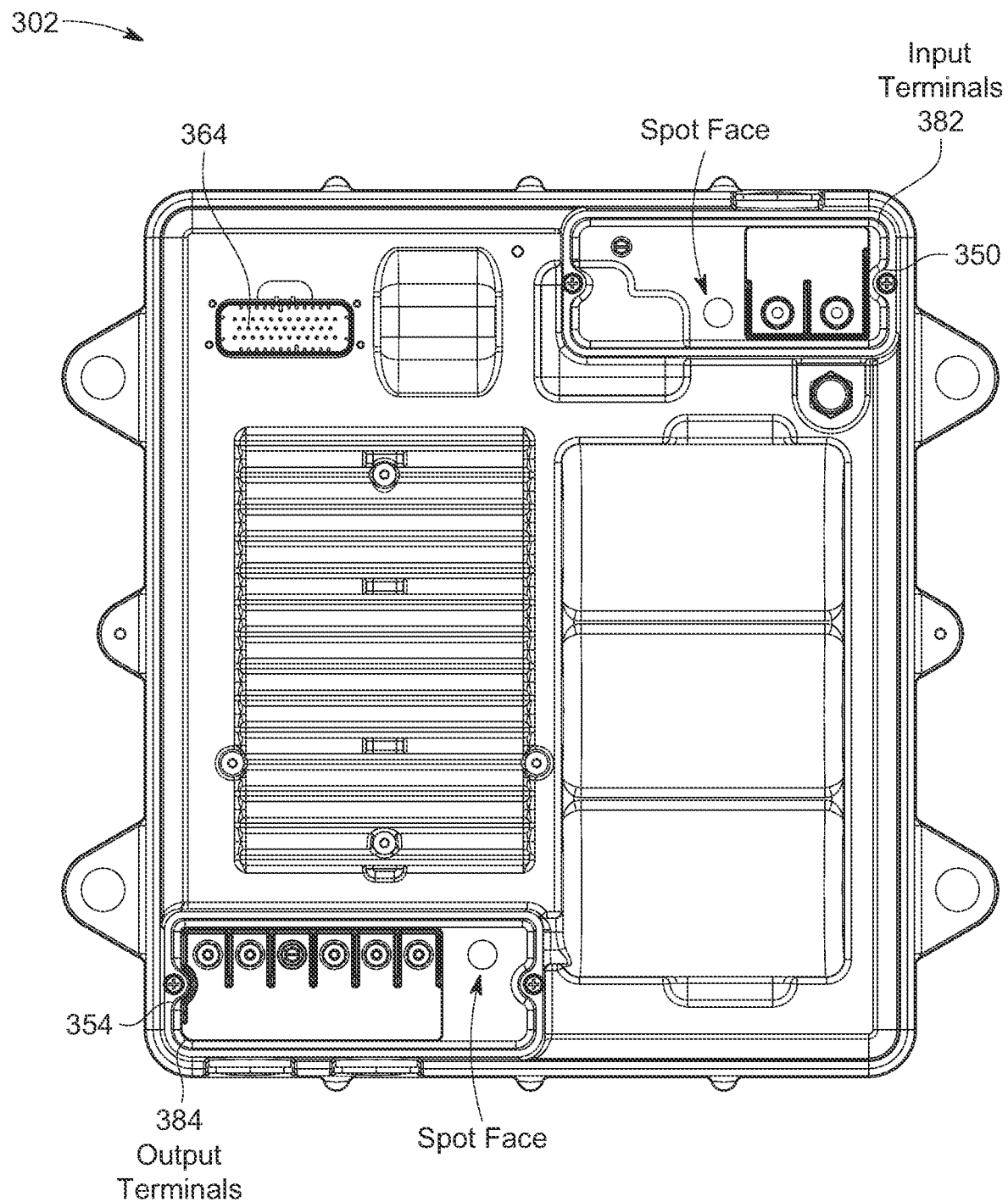
FIG. 8 is a top view of the variable frequency drive shown in FIG. 4 with the input and output covers removed from the respective input and output terminal boxes.
Figure 11:
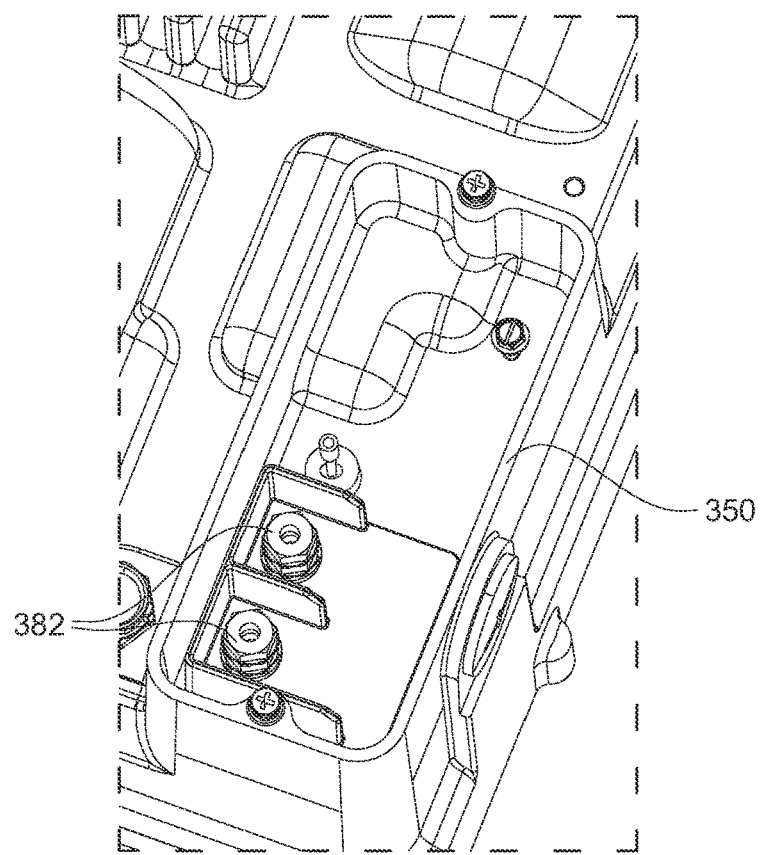
FIG. 11 is a perspective view illustrating input terminals of the input terminal box of the variable frequency drive shown in FIG. 8.

FIG. 11 illustrates input terminals 382 of the input terminal box 350 of the variable frequency drive 302 shown in FIG. 8. DC input power may be supplied to the variable frequency drive 302 by the input terminals 382.

Figure 12:
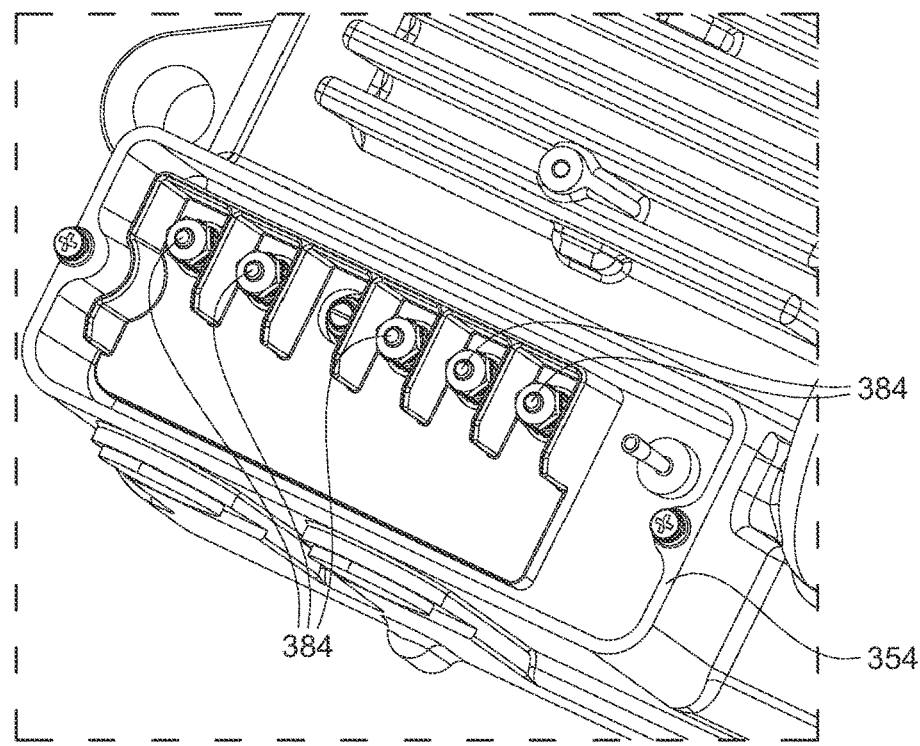
FIG. 12 is a perspective view illustrating output terminals of the output terminal box of the variable frequency drive shown in FIG. 8.

FIG. 12 illustrates output terminals 384 of the output terminal box 354 of the variable frequency drive 302 drive shown in FIG. 8. The L1, L2, and L3 connections are the output of the drive 302. The L1, L2, and L3 terminals may be connected to a compressor to provide AC input to the compressor. The SP+ (shore positive) and SP− (shore negative) terminals may be configured as an output end of the drive 302 that enables the drive 302 to charge input batteries whenever the vehicle is not running and is externally being charged from an external power source.

FIG. 14 illustrates exemplary HVIL interlock circuits 386, 388 for the input and output terminal boxes 350, 354 of the variable frequency drive 302 shown in FIG. 4 according to an exemplary embodiment. Except for their placement in different locations along a PCB, the HVIL interlock circuits 386, 388 may be essentially identical or similar. For the sake of brevity, identical or similar features shared by the HVIL interlock circuits 386, 388 will be described together and will not be individually repeated for each HVIL interlock circuit 386, 388.

Each circuit 388, 386 includes a Hall effect sensor 380. Each circuit 388, 386 includes an external bypass capacitor (C758, C759) (e.g., 0.1 µF capacitor, etc.) connected (in close proximity to the Hall effect sensor 380) between the supply (3V3 to 24V) and ground. The external bypass capacitors C758 and C759 may help ensure correct performance under harsh environmental conditions and reduce noise from internal circuitry.

The circuits 388, 386 respectively include J16 and J19 connectors, which may comprise PCB mounted connectors that are soldered directly onto a PCB. The J16 and J19 connectors may be used to bypass the HVIL circuitry if needed. For example, if the variable frequency drive 302 is a 48V drive, then a jumper may be installed on the J19 connector of the HVIL circuitry 386 for the input terminal box 350 so that the input side HVIL is not enabled when there is no input terminal box installed. In an alternative embodiment, the HVIL interlock circuits 386, 388 do not include any jumpers installed on their respective J19 or J16 connectors so that both the input side and the output side terminal boxes 350, 354 have their respective HVIL circuitry 386, 388 enabled always.

The circuits 388 and 386 include 10 nanoFarad (nF) capacitors (C640, C641, C654, C653) placed next to field programmable gate array (FPGA) pins. Each circuit 388, 386 includes two Schottky diodes (DN3, DN4) connected in series between ground and 3V3. The circuits 388 and 386 include electrostatic discharge (ESD) protection diodes (D155, D162) and ferrite beads (FB35, FB36, FB37, FB38). The electrostatic discharge (ESD) protection diode D155, D162 is connected in parallel with the capacitors C640, 641 or C654, C653 of the corresponding circuit 388, 386.

The circuits 388 and 386 further include resistors R935 and R936, respectively, each having a resistance of 47K ohms. Each resistor R935 and R936 is connected in parallel with the Hall effector sensor 380 of the respective circuit 388, 386.

The circuits 388 and 836 respectively include resistors R813 and R854 each having a resistance of 47K ohms, resistors R814 and R853 each having a resistance of 20K ohms, resistors R815 and R849 each having a resistance of 47 ohms, resistors R816 and R851 each having a resistance of 47 ohms, resistors R817 and R850 each having a resistance of 47 ohms, resistors R818 and R852 each having a resistance of 47 ohms, and resistors R913 and R914 each having a resistance of 20K ohms.

Each resistor R913, R914 is connected in parallel with the corresponding pair of capacitors C640, 641 or C654, C653 of the corresponding circuit 388, 386.

The resistors R813, R815, R817 and ferrite bead FB35 of the circuit 388 are connected in series between HVIL_COMP and terminal 1 of the J16 connector. The resistors R816, R818 and ferrite bead FB36 of the circuit 388 are connected in series between ground and terminal 2 of the J16 connector.

The resistors R854, R849, R850 and ferrite bead FB37 of the circuit 386 are connected in series between HVIL_SHORE and terminal 1 of the J19 connector. The resistors R851, R852 and ferrite bead FB38 of the circuit 386 are connected in series between ground and terminal 2 of the J19 connector.

In exemplary embodiments disclosed herein, Hall effect sensors are used for sensing the presence of the magnetic fields of the magnets. Alternatively, other magnetic sensors may be used in alternative embodiments. In addition, the magnets may comprise any element constructed from a magnetic material or having magnetic properties, such as a permanent magnet or an electromagnet.

Alternative embodiments may include a magnet within the terminal wiring housing(s) and the cover having the magnetic sensor (e.g., Hall effect sensor, etc.). For example, the cover may include a wireless lithium rechargeable battery-powered Hall effect proximity sensor that is recharged when the cover is closed and installed on the housing. Terminals may be used that connect the Hall effect circuit in the cover to low voltage power from a panel assembly.

In exemplary embodiments, the variable frequency drive is operable for sensing or determining the input voltage, e.g., 48 VDC, 350 VDC, 650 VDC, etc. For example, the variable frequency drive may be operable or sensing a 48 VDC input from a mobile refrigeration application in which the vehicle has an internal combustion engine and four twelve-volt batteries that are connected in series. Or, for example, the variable frequency drive may be operable for sensing a 650 VDC input for an electric vehicle including a battery pack generating 200 VDC and boosted to a bus voltage of 650 VDC.

In exemplary embodiments, the variable frequency drive comprises DC-DC converter. The DC-DC converter is configured to be operable to receive a 48 VDC or 650 VDC input and output 380 VDC to run a compressor in a vapor-compression system. The variable frequency drive is able to determine whether the output cover is installed or removed depending on whether or not the Hall effect sensor is closed or opened. The Hall effect sensor will be closed if it senses the magnetic field from the magnet of the output cover of the terminal wiring housing for output power. The Hall effect sensor will be open if the magnetic field from the magnet of the output cover is not sensed. As a function of the input from the closed or open status of the Hall effect sensor, the variable frequency drive then respectively enables the output section if the output cover is installed or disables the output section if the output cover is removed.

For the 650 VDC high voltage input, both the input and output covers must be installed and the magnets thereof must be detected by the Hall effect sensors to enable the variable frequency drive, as both the high input and output voltages are considered dangerous. But if the input voltage is 48 VDC, then only the output cover must be in place to enable the variable frequency drive as the 48 VDC voltage is intrinsically safe. In this latter example, the Hall effect sensor within the first terminal wiring housing for input power may be configured to remain closed such that the input voltage is enabled regardless of whether the input cover is installed or removed from the first terminal wiring housing.

In an exemplary embodiment, the 650 VDC voltage input may be provided by a traction drive that will power an electric vehicle. The output of the traction drive is fed into the variable frequency drive. In another exemplary embodiment, the 650 VDC voltage input may be provided from a battery bank or a from a generator set that is rectifying the voltage to DC. In a further exemplary embodiment, a 460 V generator in a refrigerated trailer may be configured to output to a rectifier, which, in turn, outputs 650 VDC as the voltage input to the variable frequency drive. In an additional exemplary embodiment, the variable frequency drive may receive a 380 VAC to 460 VAC input voltage directly from a generator in a bus, marine vessel, etc.

In exemplary embodiments, the output from the variable frequency drive is AC, and the threshold for having a HVIL (high voltage interlock) is 60 volts. Accordingly, any output at 60 volts or greater requires a HVIL. The output of the variable frequency drive depends on the particular compressor being driven, and the variable frequency drive is configured to accommodate this.

In exemplary embodiments, the HVIL system may be configured to be operable to enable or disable active operation of a variable frequency drive in a transport application having an output voltage of about 350 V (e.g., within a range from about 300 V to about 500 V, etc.). For example, the output voltage may be provided from a 100 cell battery bank in which each cell in the battery bank is around 1.3 V to 1.7 V depending on composition of the battery. The batteries are all linked together such that the output voltage is about 350 V, which varies during use from low to high charge.

In exemplary embodiments, the output voltage is 380V, and the output to a compressor is AC. Also, the input to the variable frequency drive is DC.

In exemplary embodiments, the variable frequency drive comprises an inverter that is configured to receive 48 VDC, 650 VDC, or 350 VDC input, boost or buck the DC, and then invert to generate an output voltage in AC, 120 VAC, or 240 VAC to drive a compressor. The variable frequency drive may be configured to output 3 phase power that is above the 60 V safety threshold, which output voltage is controlled depending on the motor design. Because the output of the variable frequency drive is higher than 60 V, the variable frequency drive is provided with an exemplary embodiment of a magnetic HVIL safety device as disclosed herein.

Exemplary embodiments disclosed herein may be configured to be operable to enable or disable active operation of variable frequency drives in various transport applications, such as transport applications having an output voltage of at least 60 VDC (e.g., electric vehicles, hybrid vehicles, etc.) and/or an input voltage of at least 48 VDC (e.g., 48 VDC, 350 VDC, 650 VDC, etc.). For example, an exemplary embodiment of a HVIL system disclosed herein may be used for a vehicle having about 650 VDC input voltage (e.g., within a range from about 500 VDC to about 850 VDC, etc.), such as an electric vehicle, municipal bus, electric commercial vehicle, agricultural vehicle, construction vehicle, passenger car, etc. Or, for example, an exemplary embodiment of a HVIL system may be used for a vehicle having about 48 VDC input voltage (e.g., within a range from about 36 VDC to about 60 VDC, etc.), such as a mobile refrigeration vehicle with an internal combustion engine, hybrid vehicle, forklift, golf cart, electric truck refrigeration unit, etc. As yet another example, an exemplary embodiment of a HVIL system may be used for a vehicle having about 350 VDC input voltage (e.g., within a range from about 300 V to about 500 V, etc.), such as a passenger car, etc. But exemplary embodiments disclosed herein may also be configured for use with other high voltage drives, AC input voltages, other transport applications, etc. Accordingly, exemplary embodiments of the present disclosure should not be limited to use with any one particular input voltage, output voltage, vehicle, transport application, etc.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A magnetic high voltage interlock loop (HVIL) system for a drive of a transport application, the magnetic HVIL system comprising:
    a Hall effect sensor within at least one housing of the drive that includes terminals and a removable cover;
    the removable cover includes a magnet having a magnetic field that is detectable by the Hall effect sensor when the removable cover is installed on the housing, the magnetic field of the magnet is not detectable by the Hall effect sensor when the removable cover is removed from the housing;
    whereby the magnetic HVIL system is configured to be operable to:
        enable active operation of the drive when the Hall effect sensor detects the magnetic field of the magnet and is in a closed circuit condition; and
        disable operation of the drive when the Hall effect sensor does not detect the magnetic field of the magnet and is in an open circuit condition;
    wherein:
        the removable cover includes an inwardly protruding portion that projects into an interior of the housing when the removable cover is installed on the housing;
        the inwardly protruding portion includes the magnet;
        the magnet is mechanically fastened to the inwardly protruding portion of the removable cover;
        the magnet includes an opening;
        a threaded insert is within an opening of the inwardly protruding portion; and
        a threaded mechanical fastener is inserted through the opening of the magnet and threadedly engaged with the threaded insert, to thereby mechanically fasten the magnet to the inwardly protruding portion of the removable cover.

2. The magnetic HVIL system of claim 1, wherein:
    the magnet having the opening comprises a circular ring magnet having a circular thru-hole; and
    the inwardly protruding portion of the removable cover comprises a boss integral with the removable cover.

3. The magnetic HVIL system of claim 1, wherein the at least one housing of the drive comprises at least one of a first terminal wiring housing for input power and/or a second terminal wiring housing for output power.

4. The magnetic HVIL system of claim 1, wherein the at least one housing of the drive comprises at least one of an input terminal box and/or an output terminal box.

5. The magnetic HVIL system of claim 1, wherein:
    the drive comprises a variable frequency drive including a first terminal wiring housing for input power and having a first removable cover, and a second terminal wiring housing for output power and having a second removable cover;
    the Hall effect sensor comprises a first Hall effect sensor within the first terminal wiring housing, and a second Hall effect sensor within the second terminal wiring housing; and
    the magnet comprises:
        a first magnet installed on the first removable cover such that a magnetic field of the first magnet is detectable by the first Hall effect sensor when the first removable cover is installed on the first terminal wiring housing and such that the magnetic field of the first magnet is not detectable by the first Hall effect sensor when the first removable cover is removed from the first terminal wiring housing; and
        a second magnet installed on the second removable cover such that a magnetic field of the second magnet is detectable by the second Hall effect sensor when the second removable cover is installed on the second terminal wiring housing and such that the magnetic field of the second magnet is not detectable by the second Hall effect sensor when the second removable cover is removed from the second terminal wiring housing.

6. The magnetic HVIL system of claim 1, wherein:
    the drive comprises a variable frequency drive including an input terminal box having a first removable cover, and an output terminal box having a second removable cover;
    the Hall effect sensor comprises a first Hall effect sensor within the input terminal box, and a second Hall effect sensor within the output terminal box; and
    the magnet comprises:
        a first magnet installed on the first removable cover such that a magnetic field of the first magnet is detectable by the first Hall effect sensor when the first removable cover is installed on the input terminal box and such that the magnetic field of the first magnet is not detectable by the first Hall effect sensor when the first removable cover is removed from the input terminal box; and
        a second magnet installed on the second removable cover such that a magnetic field of the second magnet is detectable by the second Hall effect sensor when the second removable cover is installed on the output terminal box and such that the magnetic field of the second magnet is not detectable by the second Hall effect sensor when the second removable cover is removed from the output terminal box.

7. The magnetic HVIL system of claim 1, wherein the magnetic HVIL system includes a control in communication with the Hall effect sensor, whereby the control is operable for enabling voltage to the terminals substantially instantaneously when the magnetic field of the magnet is detected by the Hall effect sensor and the Hall effect sensor is in a closed circuit condition, and whereby the control is operable for disabling voltage to the terminals substantially instantaneously when the magnetic field of the magnet is not detected by the Hall effect sensor and the Hall effect sensor is in an open circuit condition.

8. The magnetic HVIL system of claim 1, wherein the removable cover includes a lower portion configured such that the terminals remain covered by the removable cover and are inaccessible until the magnet is out of a detection range of the Hall effect sensor for HVIL disengagement.

9. A variable frequency drive comprising the magnetic HVIL system of claim 1.

10. A vehicle comprising a variable frequency drive including the magnetic HVIL system of claim 1, wherein:
the vehicle is an electric vehicle, a hybrid vehicle, or a mobile refrigeration vehicle including an internal combustion engine; and/or
the variable frequency drive is configured to have an input voltage of 48 VDC, 350 VDC, or 650 VDC and/or an output voltage of at least 60 VDC.

11. A variable frequency drive comprising a magnetic high voltage interlock loop (HVIL) that comprises:
a Hall effect sensor within at least one housing of the variable frequency drive that includes terminals and a removable cover;
the removable cover includes a magnet having a magnetic field that is detectable by the Hall effect sensor when the removable cover is installed on the housing, the magnetic field of the magnet is not detectable by the Hall effect sensor when the removable cover is removed from the housing;
whereby the magnetic HVIL system is configured to be operable to:
enable active operation of the variable frequency drive when the Hall effect sensor detects the magnetic field of the magnet and is in a closed circuit condition; and
disable operation of the variable frequency drive when the Hall effect sensor does not detect the magnetic field of the magnet and is in an open circuit condition;
wherein the terminals comprise:
shore power positive and negative terminals configured to enable the variable frequency drive to charge input batteries of a vehicle when the vehicle is not running and is externally being charged from an external power source; and/or
input terminals connectible with a DC input power supply for the variable frequency drive; and/or
output terminals connectible with a compressor to provide AC input to the compressor.

12. The variable frequency drive of claim 11, wherein:
the removable cover includes an inwardly protruding portion that projects into an interior of the housing when the removable cover is installed on the housing; and
the inwardly protruding portion includes the magnet.

13. The variable frequency drive of claim 12, wherein the magnet is mechanically fastened to the inwardly protruding portion of the removable cover.

14. The variable frequency drive of claim 13, wherein:
the magnet includes an opening;
a threaded insert is within an opening of the inwardly protruding portion; and
a threaded mechanical fastener is inserted through the opening of the magnet and threadedly engaged with the threaded insert, to thereby mechanically fasten the magnet to the inwardly protruding portion of the removable cover.

15. The variable frequency drive of claim 11, wherein:
the removable cover comprises a first removable cover and a second removable cover;
the at least one housing of the variable frequency drive comprise a first housing including the first removable cover and a second housing including the second removable cover;
the Hall effect sensor comprises a first Hall effect sensor within the first housing, and a second Hall effect sensor within the second housing; and
the magnet comprises:
a first magnet installed on the first removable cover such that a magnetic field of the first magnet is detectable by the first Hall effect sensor when the first removable cover is installed on the first housing and such that the magnetic field of the first magnet is not detectable by the first Hall effect sensor when the first removable cover is removed from the first housing; and
a second magnet installed on the second removable cover such that a magnetic field of the second magnet is detectable by the second Hall effect sensor when the second removable cover is installed on the second housing and such that the magnetic field of the second magnet is not detectable by the second Hall effect sensor when the second removable cover is removed from the second housing;
wherein the variable frequency drive is configured such that the first and second removable covers must be installed on the respective first and second terminal wire housings to enable the variable frequency drive for a 650 VDC input but only the second removable cover must be installed on the second terminal wire housing to enable the variable frequency drive for a 48 VDC input.

16. The variable frequency drive of claim 11, wherein:
the removable cover comprises a first removable cover and a second removable cover;
the at least one housing of the variable frequency drive comprises a first housing including input terminals and the first removable cover, and a second housing including output terminals and the second removable cover;
the Hall effect sensor comprises a first Hall effect sensor within the first housing, and a second Hall effect sensor within the second housing; and
the magnet comprises:
a first magnet installed on the first removable cover such that a magnetic field of the first magnet is detectable by the first Hall effect sensor when the first removable cover is installed on the first housing and such that the magnetic field of the first magnet is not detectable by the first Hall effect sensor when the first removable cover is removed from the first housing; and
a second magnet installed on the second removable cover such that a magnetic field of the second magnet is detectable by the second Hall effect sensor when the second removable cover is installed on the second housing and such that the magnetic field of the second magnet is not detectable by the second Hall effect sensor when the second removable cover is removed from the second housing;

wherein the variable frequency drive is configured such that:

for a 650 VDC input, the input terminals of the first housing and the output terminals of the second housing are disabled until the first and second removable covers are installed on the respective first and second housings; and for a 48 VDC input, the input terminals of the first housing are not disabled but the output terminals of the second housing are disabled until the second removable cover is installed on the second housing.

17. A variable frequency drive for a vehicle comprising:
a first terminal wiring housing for input power and having a first removable cover;
a second terminal wiring housing for output power and having a second removable cover; and
a magnetic high voltage interlock loop (HVIL) system including:
   a first Hall effect sensor within the first terminal wiring housing;
   a second Hall effect sensor within the second terminal wiring housing;
   the first removable cover including a first magnet having a magnetic field that is detectable by the first Hall effect sensor when the first removable cover is installed on the first terminal wiring housing, the magnetic field of the first magnet is not detectable by the first Hall effect sensor when the first removable cover is removed from the first terminal wiring housing; and
   the second removable cover including a second magnet having a magnetic field that is detectable by the second Hall effect sensor when the second removable cover is installed on the second terminal wiring housing, the magnetic field of the second magnet is not detectable by the second Hall effect sensor when the second removable cover is removed from the second terminal wiring housing;

wherein:
the first removable cover includes a first inwardly protruding portion that projects into an interior of the first terminal wiring housing when the first removable cover is installed on the first terminal wiring housing;
the first magnet is mechanically fastened to the first inwardly protruding portion of the first removable cover via a first mechanical fastener inserted through a first opening of the first magnet and threadedly engaged with a first threaded insert within a first opening of the first inwardly protruding portion;
the second removable cover includes a second inwardly protruding portion that projects into an interior of the second terminal wiring housing when the second removable cover is installed on the second terminal wiring housing; and
the second magnet is mechanically fastened to the second inwardly protruding portion of the second removable cover via a second mechanical fastener inserted through a second opening of the second magnet and threadedly engaged with a second threaded insert within a second opening of the second inwardly protruding portion.

18. The variable frequency drive of claim 17, wherein:
the first removable cover includes a lower portion configured such that input terminals within the first terminal wiring housing remain covered by the first removable cover and are inaccessible until the first magnet is out of a detection range of the first Hall effect sensor for HVIL disengagement; and
the second removable cover includes a lower portion configured such that output terminals within the second terminal wiring housing remain covered by the second removable cover and are inaccessible until the second magnet is out of a detection range of the second Hall effect sensor for HVIL disengagement.

19. The variable frequency drive of claim 17, wherein:
the first terminal wiring housing comprises an input terminal box of the variable frequency drive; and
the second terminal wiring housing comprises an output terminal box of the variable frequency drive.

20. A vehicle comprising the variable frequency drive of claim 17, wherein:
the vehicle is an electric vehicle, a hybrid vehicle, or a mobile refrigeration vehicle including an internal combustion engine; and/or
the variable frequency drive is configured to have an input voltage of 48 VDC, 350 VDC, or 650 VDC and/or an output voltage of at least 60 VDC.

21. A variable frequency drive for a vehicle comprising:
a first terminal wiring housing for input power and having a first removable cover;
a second terminal wiring housing for output power and having a second removable cover; and
a magnetic high voltage interlock loop (HVIL) system including:
   a first Hall effect sensor within the first terminal wiring housing;
   a second Hall effect sensor within the second terminal wiring housing;
   the first removable cover including a first magnet having a magnetic field that is detectable by the first Hall effect sensor when the first removable cover is installed on the first terminal wiring housing, the magnetic field of the first magnet is not detectable by the first Hall effect sensor when the first removable cover is removed from the first terminal wiring housing; and
   the second removable cover including a second magnet having a magnetic field that is detectable by the second Hall effect sensor when the second removable cover is installed on the second terminal wiring housing, the magnetic field of the second magnet is not detectable by the second Hall effect sensor when the second removable cover is removed from the second terminal wiring housing;

wherein:
the first terminal wiring housing includes input terminals connectible with a DC input power supply for the variable frequency drive; and
the second terminal wiring housing includes output terminals connectible with a compressor to provide AC input to the compressor and/or shore power positive and negative terminals configured to enable the variable frequency drive to charge input batteries of the vehicle when the vehicle is not running and is externally being charged from an external power source.

22. The variable frequency drive of claim 21, wherein the variable frequency drive is configured such that the first and second removable covers must be installed on the respective first and second terminal wire housings to enable the variable frequency drive for a 650 VDC input but only the second removable cover must be installed on the second terminal wire housing to enable the variable frequency drive for a 48 VDC input.

23. The variable frequency drive of claim 21, wherein the variable frequency drive is configured such that:
for a 650 VDC input, the input terminals of the first terminal wiring housing and the output terminals of the second terminal wiring housing are disabled until the first and second removable covers are installed on the respective first and second terminal wire housings; and
for a 48 VDC input, the input terminals of the first terminal wiring housing are not disabled but the output terminals of the second terminal wiring housing are disabled until the second removable cover is installed on the second terminal wire housing.

* * * * *